United States Patent
Emira et al.

(10) Patent No.: US 11,159,186 B2
(45) Date of Patent: *Oct. 26, 2021

(54) TRANSMITTER WITH COMPENSATION OF VCO PULLING

(71) Applicant: SHENZHEN GOODIX TECHNOLOGY CO., LTD., Shenzhen (CN)

(72) Inventors: Ahmed Emira, San Diego, CA (US); Faisai Hussien, San Diego, CA (US); Esmail Babakrpur Nalousi, San Diego, CA (US)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/739,094

(22) Filed: Jan. 9, 2020

(65) Prior Publication Data

US 2021/0218425 A1  Jul. 15, 2021

(51) Int. Cl.
*H03F 3/24*  (2006.01)
*H04B 1/04*  (2006.01)
(Continued)

(52) U.S. Cl.
CPC .............. *H04B 1/04* (2013.01); *H03C 3/0983* (2013.01); *H03F 3/24* (2013.01); *H04B 17/11* (2015.01);
(Continued)

(58) Field of Classification Search
CPC ......... G01S 13/32; H03C 3/0983; H03F 3/24; H03K 5/133; H03K 5/1252; H03L 7/06; H03L 7/16; H03L 7/18; H03L 7/089; H03L 7/093; H03L 7/099; H04B 1/02; H04B 1/04; H04B 1/38; H04B 1/66; H04B 5/00; H04B 17/11; H04L 7/00; H04L 7/04; H04L 7/0041
USPC ......... 327/233, 250, 261, 276; 375/295–297, 375/300, 371; 455/86, 102, 127.2, 260, 455/556.1
See application file for complete search history.

(56) References Cited

U.S. PATENT DOCUMENTS 10,879,915 B1* 12/2020 Emira ..................... H04B 1/02
2006/0067427 A1* 3/2006 Zolfaghari ............ H03F 1/0211
375/297

(Continued)

FOREIGN PATENT DOCUMENTS

| CN | 108306628 A | 7/2018 |
| CN | 109995362 A | 7/2019 |
| CN | 110476352 A | 11/2019 |

*Primary Examiner* — Shawkat M Ali
(74) *Attorney, Agent, or Firm* — Kilpatrick Townsend & Stockton LLP

(57) ABSTRACT

A transmitter circuit is disclosed. The transmitter circuit includes a frequency circuit configured to generate a frequency signal, a power amplifier configured to drive an antenna with a drive signal according to the frequency signal, and a programmable delay circuit configured to controllably extend a propagation delay between the frequency signal generated by the frequency circuit and the drive signal of the power amplifier. The programmable delay circuit is programmed with a programming value which causes the transmitter circuit to pass a calibration test.

17 Claims, 2 Drawing Sheets

(51) Int. Cl.
*H04B 17/11* (2015.01)
*H03C 3/09* (2006.01)

(52) U.S. Cl.
CPC .............. *H04B 2001/0408* (2013.01); *H04B 2001/0491* (2013.01)

(56) References Cited

U.S. PATENT DOCUMENTS

| | | | |
|---|---|---|---|
| 2009/0074106 A1* | 3/2009 | See | H04L 27/0008 375/297 |
| 2012/0120992 A1* | 5/2012 | Soltanian | H03L 7/193 375/221 |
| 2014/0185723 A1* | 7/2014 | Belitzer | H04L 7/0337 375/354 |
| 2014/0321423 A1* | 10/2014 | Kalhan | H04L 5/0053 370/330 |
| 2015/0229317 A1* | 8/2015 | Juneau | H03C 3/0966 327/105 |
| 2018/0110018 A1 | 4/2018 | Yu et al. | |
| 2018/0188317 A1* | 7/2018 | Maiellaro | G01R 31/2832 |
| 2018/0254774 A1* | 9/2018 | Thijssen | H03L 7/0805 |
| 2019/0072657 A1 | 3/2019 | Delos et al. | |
| 2021/0175855 A1* | 6/2021 | Srinivasan | H03F 1/26 |

\* cited by examiner

TRANSMITTER WITH COMPENSATION OF VCO PULLING

FIELD OF THE INVENTION

The present application generally pertains to transmitter circuits, and more particularly to transmitter circuits which have low frequency shift induced as a result of the power amplifier.

BACKGROUND OF THE INVENTION

Transmitter circuits frequently have a phase locked loop (PLL) circuit which generates a signal which is modulated with an information carrying signal and transmitted with an antenna driven by a power amplifier. The power amplifier tends to generate a signal which is coupled to the PLL. The coupled signal disturbs the output of the PLL, such that the frequency output of the PLL is undesirably shifted from its intended target. This phenomenon may be called pulling or VCO pulling.

BRIEF SUMMARY OF THE INVENTION

One inventive aspect is a transmitter circuit. The transmitter circuit includes a frequency circuit configured to generate a frequency signal, a power amplifier configured to drive an antenna with a drive signal according to the frequency signal, and a programmable delay circuit configured to controllably extend a propagation delay between the frequency signal generated by the frequency circuit and the drive signal of the power amplifier. The programmable delay circuit is programmed with a programming value which causes the transmitter circuit to pass a calibration test.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1A:
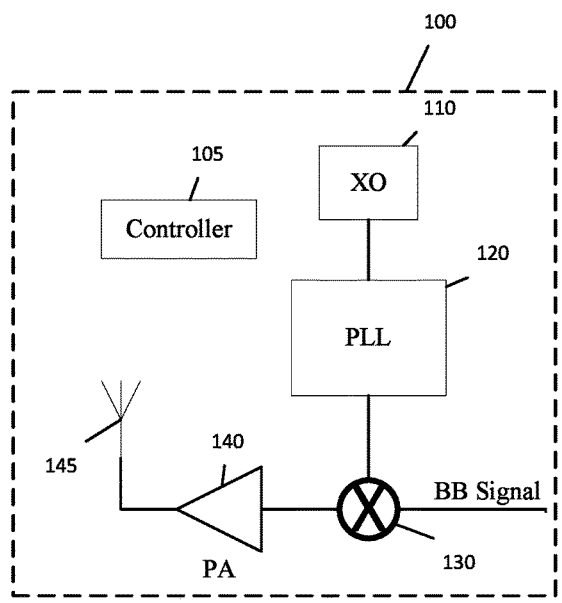
FIGS. 1A and 1B are schematic diagrams of transmitter circuits according to an embodiment.

FIG. 1A is a schematic diagram of a linear or direct conversion transmitter circuit 100 according to an embodiment.

Linear conversion transmitter circuit 100 includes controller 105, crystal oscillator (XO) circuit 110, phase locked loop circuit 120, mixer 130, power amplifier 140, and antenna 145.

Crystal oscillator circuit 110 generates a reference frequency which is used by phase locked loop circuit 120 to generate an RF transmission frequency signal. Mixer 130 modulates the RF transmission frequency signal with a baseband signal (BB signal) carrying information to be transmitted. The modulated RF transmission frequency signal is provided to power amplifier 140, and power amplifier 140 drives the antenna 145 with a power amplified modulated RF transmission frequency signal. Consequently, the power amplified modulated RF transmission frequency signal is broadcast by the antenna 145.

Controller 105 generates control signals which control various programmable parameters of one or more of crystal oscillator circuit 110, phase locked loop circuit 120, mixer 130, power amplifier 140, and antenna 145, as understood by one of ordinary skill in the art.

Figure 1B:
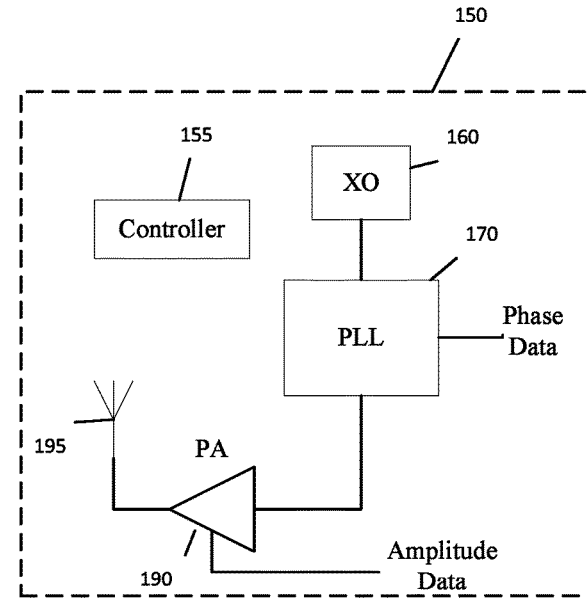

FIG. 1B is a schematic diagram of a polar transmitter circuit 150 according to an embodiment.

Polar transmitter circuit 150 includes controller 155, crystal oscillator circuit 160, phase locked loop circuit 170, power amplifier 190, and antenna 195.

Crystal oscillator circuit 160 generates a reference frequency which is used by phase locked loop circuit 170 to generate an RF transmission frequency signal. The phase locked loop circuit 170 receives phase data and modulates the generated RF transmission frequency signal with the phase data. The modulated RF transmission frequency signal is provided to power amplifier 190, which also receives amplitude data. Power amplifier 190 further modulates modulated RF transmission frequency signal with the amplitude data, and power amplifier 190 drives the antenna 195 with the RF transmission frequency signal modulated with both phase and amplitude data. Consequently, the RF transmission frequency signal with both phase and amplitude data is broadcast by the antenna 195.

Controller 155 generates control signals which control various programmable parameters of one or more of crystal oscillator circuit 160, phase locked loop circuit 170, power amplifier 190, and antenna 195, as understood by one of ordinary skill in the art.

Figure 2A:
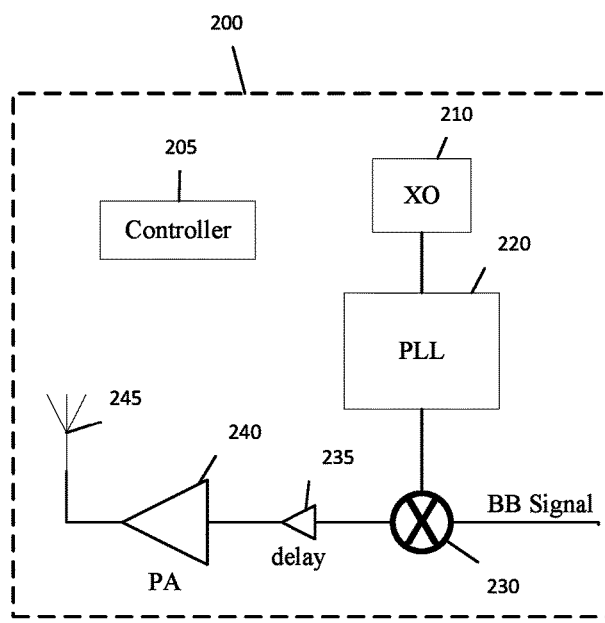
FIGS. 2A and 2B are schematic diagrams of transmitter circuits according to other embodiments.

FIG. 2A is a schematic diagram of a linear or direct conversion transmitter circuit 200 according to another embodiment.

Linear conversion transmitter circuit 200 includes crystal oscillator circuit 210, phase locked loop circuit 220, mixer 230, programmable delay element 235, power amplifier 240, and antenna 245.

Crystal oscillator circuit 210 generates a reference frequency which is used by phase locked loop circuit 220 to generate an RF transmission frequency signal. Mixer 230 modulates the RF transmission frequency signal with a baseband signal carrying information to be transmitted. The modulated RF transmission frequency signal is delayed by programmable delay element 235 and provided to power amplifier 240. Power amplifier 240 then drives the antenna 245 with a power amplified delayed modulated RF transmission frequency signal. Consequently, the power amplified delayed modulated RF transmission frequency signal is broadcast by the antenna 245.

In alternative embodiments, programmable delay element 235 receives the RF transmission frequency signal from phase locked loop circuit 170 and provides a delayed version of the RF transmission frequency signal to the mixer 230. In such embodiments, the mixer 230 provides a delayed RF transmission frequency signal modulated by the baseband signal directly to the power amplifier 240.

Controller 205 generates control signals which control various programmable parameters of one or more of crystal oscillator circuit 210, phase locked loop circuit 220, mixer 230, programmable delay element 235, power amplifier 240, and antenna 245, as understood by one of ordinary skill in the art.

For example, controller 205 may generate control signals for programmable delay element 235, such that programmable delay element 235 adjusts and controls the amount of delay the modulated RF transmission frequency signal experiences as a consequence of being processed by programmable delay element 235. An embodiment of a method of determining the control signals is discussed below with reference to FIG. 4, below.

Figure 2B:
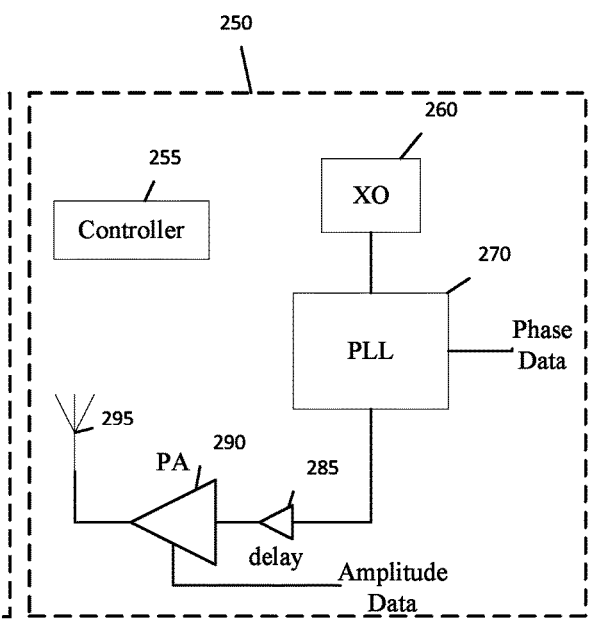

FIG. 2B is a schematic diagram of a polar transmitter circuit 250 according to an embodiment.

Polar transmitter circuit 250 includes controller 255, crystal oscillator circuit 260, phase locked loop circuit 270, programmable delay element 285, power amplifier 290, and antenna 295.

Crystal oscillator circuit 260 generates a reference frequency which is used by phase locked loop circuit 270 to generate an RF transmission frequency signal. The phase locked loop circuit 270 receives phase data and modulates the generated RF transmission frequency signal with the phase data. The modulated RF transmission frequency signal is delayed by programmable delay element 285 and provided to power amplifier 290. Power amplifier 290 also receives amplitude data, and modulates the delayed modulated RF transmission frequency signal with the amplitude data. Power amplifier 290, accordingly, drives the antenna 295 with the delayed modulated RF transmission frequency signal modulated with both phase and amplitude data. Consequently, the delayed RF transmission frequency signal with both phase and amplitude data is broadcast by the antenna 295.

Controller 255 generates control signals which control various programmable parameters of one or more of crystal oscillator circuit 260, phase locked loop circuit 270, programmable delay element 285, power amplifier 290, and antenna 295, as understood by one of ordinary skill in the art.

For example, controller 255 may generate control signals for programmable delay element 285, such that programmable delay element 285 adjusts and controls the amount of delay the modulated RF transmission frequency signal experiences as a consequence of being processed by programmable delay element 285. An embodiment of a method of determining the control signals is discussed below with reference to FIG. 4, below.

Figure 3:
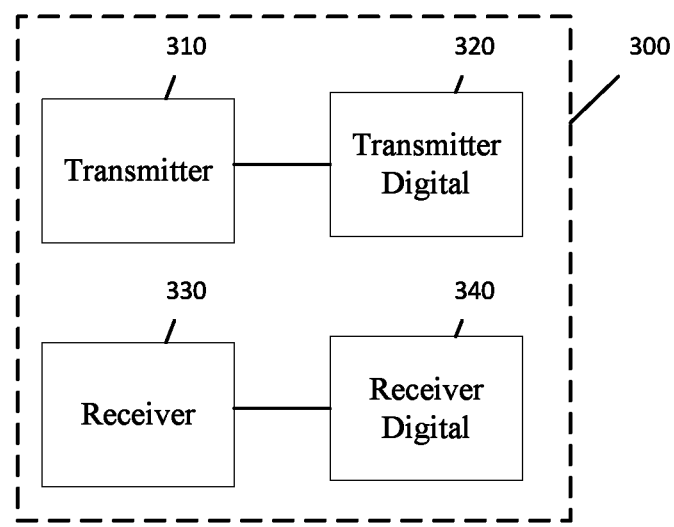
FIG. 3 is a schematic diagram of a transceiver circuit.

FIG. 3 is a schematic diagram of a transceiver circuit 300.

Transceiver circuit 300 includes transmitter 310, transmitter digital 320, receiver 330, and receiver digital 340.

Transmitter 310 is configured to receive control and data signals from transmitter digital 320, and to transmit a transmission RF signal according to the received control and data signals. Transmitter 310 may have features similar or identical to those discussed above with reference to any of transmitters 100, 150, 200, and 250, as respectively illustrated in FIGS. 1A, 1B, 2A, and 2B.

Receiver 330 is configured to receive control signals from receiver digital 340, and to receive a transmitted RF signal from an antenna. Receiver 330 is configured to extract the baseband signal from the received RF signal, and to communicate a representation of the baseband signal to the receiver digital 340.

In some embodiments, receiver 330 is configured to receive the transmission RF signal transmitted by transmitter 310. For example, transmitter digital 320 may be configured to provide control signals and a data signal to transmitter 310, such that transmitter 310 transmits a transmission RF signal encoding the data signal. In addition, receiver 330 may be configured to receive the RF signal transmitted by transmitter 310, such that receiver digital 340 receives the data signal. The data signal provided by transmitter digital 320 and the data signal received by receiver digital 340 may be substantially identical. For example, differences between the data signal provided by transmitter digital 320 and the data signal received by receiver digital 340 may be caused by imperfections, non-idealities, and noise in the transceiver circuit 300.

In some embodiments, receiver 330 is configured to receive the transmission RF signal transmitted by transmitter 310 from a power amplifier of transmitter 310 in a transmitter-receiver loopback configuration. For example, an input of receiver 330, such as an input to a low noise amplifier connected or connectable to an antenna of receiver 330, may be selectively connected to the output of the power amplifier. In such embodiments, transmitter digital 320 may be configured to provide control signals and a data signal to transmitter 310, such that transmitter 310 generates an RF signal encoding the data signal at the output of its power amplifier. In such embodiments, the power amplifier of transmitter 310 also drives a transmission antenna. In addition, receiver 330 may be configured to receive the RF signal from the power amplifier at its low noise amplifier, such that receiver digital 340 receives the data signal. The data signal provided by transmitter digital 320 and the data signal received by receiver digital 340 may be substantially identical. For example, differences between the data signal provided by transmitter digital 320 and the data signal received by receiver digital 340 may be caused by imperfections, non-idealities, and noise in the transceiver circuit 300, but are not caused by imperfections, non-idealities, and noise related to the wireless communication through the antennae of the transmitter 310 and the receiver 330.

As understood by those of skill in the art, once the transceiver 300 is to be operated to transmit and receive data, the loopback configuration may be opened.

In some embodiments, the baseband data signal generated by transmitter digital 320 may include test data, and the baseband data signal received by receiver digital 340 may be analyzed in order to characterize imperfections, non-idealities, and noise in the transceiver system. The analysis provides an indication of the disturbance in the output of the PLL caused by the signal coupled to the PLL from the power amplifier. Information generated by the analysis can be used to program the delay element (e.g. 235, 238) to remove or reduce the disturbance.

In some embodiments, receiver digital 340 is configured to perform the analysis. In such embodiments, receiver digital 340 may also be configured to communicate results of the analysis to transmitter digital 320 or to a controller (not shown) within transmitter digital 320. Transmitter digital 320 is configured to program the delay element according to the results to remove or reduce the disturbance.

In some embodiments, receiver digital 340 is configured to communicate the baseband data signal to transmitter digital 320. In such embodiments, transmitter digital 320 is configured to perform the analysis and to program the delay element according to the results to remove or reduce the disturbance.

In some embodiments, receiver digital 340 is configured to perform the analysis, and to communicate results of the analysis to a controller (not shown). In such embodiments, the controller communicates instructions to the transmitter digital 320 or to the delay element, which program the delay element to remove or reduce the disturbance.

Figure 4:
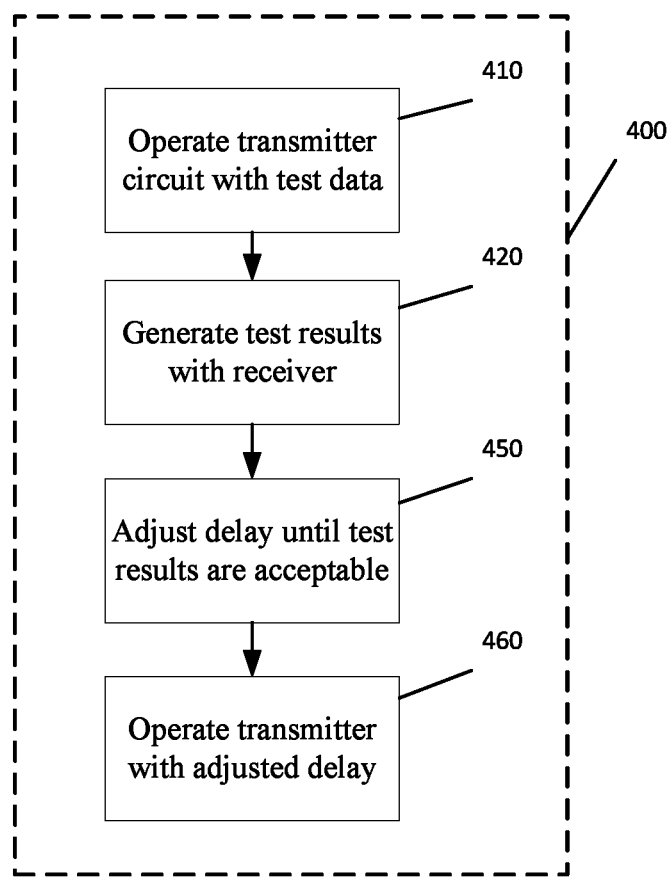
FIG. 4 is a flowchart diagram illustrating a method of operating a transmitter circuit.

FIG. 4 is a flowchart diagram illustrating a method 400 of operating a transmitter circuit, such as either of transmitter circuits 200 and 250 of FIGS. 2A and 2B, respectively. The method 400 is described below with reference to either of transmitter circuits 200 and 250 of FIGS. 2A and 2B, respectively. The transmitter circuit is coupled with a receiver circuit, for example, as described with reference to transceiver circuit 300 of FIG. 3.

At 410, the transmitter digital causes the transmitter to generate an RF signal with baseband test data. The test data may, for example, correspond with a two tone test, as understood by those of skill in the art. Other test data may alternatively or additionally be used.

At 420, the receiver receives the RF signal, and generates a baseband signal data based on the received RF signal. In addition, the baseband signal data is analyzed, for example by digital circuitry associated primarily with either of the receiver and the transmitter.

The baseband signal data at the receiver may, for example, be analyzed to determine an indication of a magnitude of a non-ideal output of the phase locked loop circuit of the transmitter. For example, the baseband signal data at the receiver may be analyzed to determine a measurement of a disturbance in the frequency of the output of the phase locked loop circuit, for example, caused by undesirable signal coupling from other components of the transmitter, such as the power amplifier (PA), to the phase locked loop circuit, for example, to a voltage control oscillator of the phase locked loop circuit.

At 450, the transmitter digital adjusts control signals provided to the delay circuit of the transmitter to adjust the delay of the delay circuit. For each adjustment, the resulting baseband signal data at the receiver is analyzed to determine an indication of a magnitude of a non-ideal output of the phase locked loop circuit of the transmitter, as described at 420.

In addition, at 450, in some embodiments, a representation of the control signal value causing a minimum non-ideality in the output of the phase locked loop circuit is stored in a memory, for example, in the controller. In some embodiments, at 450, a representation of the control signal value causing a non-ideality in the output of the phase locked loop circuit to be less than a threshold is stored in the memory.

At 460, the transmitter digital causes the transmitter to transmit an RF signal including a baseband information signal. In addition, at 460, the transmitter digital provides one or more control signals corresponding with the representation of the control signal value stored at 450 to the delay element. Consequently, the delay of the delay element at 460 is substantially identical to the delay of the delay element associated with the representation of the control signal value stored at 450.

For example, the delay of the delay element at 460 may be substantially equal to the delay of the delay element at 450 which caused the minimum non-ideality in the output of the phase locked loop circuit. As another example, the delay of the delay element at 460 may be substantially equal to the delay of the delay element at 450 which caused the non-ideality in the output of the phase locked loop circuit to be less than the threshold.

In some embodiments, at 460, the phase difference between the signal at the power amplifier output and the phase locked loop output signal may be substantially zero. Alternatively, in some embodiments, at 460, the phase difference between the signal that the power amplifier output and the phase locked loop output signal may be substantially 180°.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A transmitter circuit, comprising:
a frequency circuit configured to generate a frequency signal;
a power amplifier configured to drive an antenna with a drive signal according to the frequency signal;
a programmable delay circuit configured to controllably extend a propagation delay between the frequency signal generated by the frequency circuit and the drive signal of the power amplifier, wherein the programmable delay circuit is programmed with a programming value which causes the transmitter circuit to pass a calibration test; and
a mixer coupled between the frequency circuit and the programmable delay circuit, wherein the mixer configured to modulate the frequency signal with a baseband information carrying signal.

2. The transmitter circuit of claim 1, wherein the calibration test comprises a two tone test.

3. The transmitter circuit of claim 1, wherein the frequency circuit comprises a phase locked loop circuit.

4. The transmitter circuit of claim 1, wherein the frequency circuit is configured to modulate the frequency signal with first data of a baseband information carrying signal, and wherein the power amplifier is configured to modulate the frequency signal with second data of the baseband information carrying signal in a way that the drive signal carries the baseband information carrying signal.

5. The transmitter circuit of claim 1, wherein a phase difference between the frequency signal generated by the frequency circuit and the drive signal generated by the power amplifier is 180° or is zero.

6. A method of operating a transmitter circuit, the transmitter circuit comprising:
a frequency circuit;
a power amplifier;
a programmable delay circuit; and
a mixer coupled between the frequency circuit and the programmable delay circuit,
the method comprising:
with the frequency circuit, generating frequency signal;
with the mixer, modulating the frequency signal with a baseband information carrying signal;
with the power amplifier, driving an antenna with a drive signal according to the frequency signal; and
with the programmable delay circuit, controllably extending a propagation delay between the frequency signal generated by the frequency circuit and the drive signal of the power amplifier, wherein the programmable delay circuit is programmed with a programming value which causes the transmitter circuit to pass a calibration test.

7. The method of claim 6, wherein the calibration test comprises a two tone test.

8. The method of claim 6, wherein the frequency circuit comprises a phase locked loop circuit.

9. The method of claim 6, further comprising:
with the frequency circuit, modulating the frequency signal with first data of a baseband information carrying signal, and
with the power amplifier, modulating the frequency signal with second data of the baseband information carrying signal in a way that the drive signal carries the baseband information carrying signal.

10. The method of claim 6, wherein a phase difference between the frequency signal generated by the frequency circuit and the drive signal generated by the power amplifier is 180° or is zero.

11. A method of operating a transmitter circuit, the transmitter circuit comprising:
a frequency circuit;
a power amplifier;
a programmable delay circuit; and
a mixer coupled between the frequency circuit and the programmable delay circuit,
the method comprising:
with the frequency circuit, generating a frequency signal;
with the power amplifier, driving an antenna with a first drive signal according to the frequency signal modulated with a transmission baseband signal;
with the mixer, modulating the frequency signal with the transmission baseband signal;
with the programmable delay circuit, controllably extending a propagation delay between the frequency signal generated by the frequency circuit and the first drive signal of the power amplifier by a first amount, wherein the programmable delay circuit is programmed with a first programming value;
with a receiver circuit, receiving the first drive signal and extracting a first received baseband signal from the received first drive signal;
analyzing the first received baseband signal;
determining that the first programming value does not cause the transmitter circuit to pass a calibration test;
with the power amplifier, driving the antenna with a second drive signal according to the frequency signal modulated with the transmission baseband signal;
with the programmable delay circuit, controllably extending a propagation delay between the frequency signal generated by the frequency circuit and the second drive signal of the power amplifier by a second amount, wherein the programmable delay circuit is programmed with a second programming value;
with the receiver circuit, receiving the second drive signal and extracting a second received baseband signal from the received second drive signal;
analyzing the second received baseband signal; and
determining that the second programming value causes the transmitter circuit to pass the calibration test.

12. The method of claim 11, wherein the transmission baseband signal comprises a test signal.

13. The method of claim 11, wherein the transmission baseband signal comprises a two tone test signal.

14. The method of claim 11, wherein the frequency circuit comprises a phase locked loop circuit.

15. The method of claim 11, further comprising:
with the frequency circuit, modulating the frequency signal with first data of the transmission baseband signal, and
with the power amplifier, modulating the frequency signal with second data of the transmission baseband signal in a way that the first and second drive signal carry the transmission baseband signal.

16. The method of claim 11, wherein a phase difference between the frequency signal generated by the frequency circuit and the second drive signal generated by the power amplifier with the programmable delay circuit programmed with the second programming value is 180° or is zero.

17. The method of claim 11, further comprising:
with the power amplifier, driving the antenna with a third drive signal according to the frequency signal modulated with an information carrying baseband signal; and
with the programmable delay circuit, controllably extending a propagation delay between the frequency signal generated by the frequency circuit and the third drive signal of the power amplifier by the second amount, wherein the programmable delay circuit is programmed with the second programming value.

* * * * *

UNITED STATES PATENT AND TRADEMARK OFFICE
CERTIFICATE OF CORRECTION

| | | |
|---|---|---|
| PATENT NO. | : 11,159,186 B2 | Page 1 of 1 |
| APPLICATION NO. | : 16/739094 | |
| DATED | : October 26, 2021 | |
| INVENTOR(S) | : Ahmed Emira, Faisai Hussien and Esmail Babakrpur Nalousi | |

It is certified that error appears in the above-identified patent and that said Letters Patent is hereby corrected as shown below:

On the Title Page

Item (72): Please delete "Faisai Hussien" and insert --"Faisal Hussien"--

Signed and Sealed this
Eighth Day of February, 2022

Drew Hirshfeld
*Performing the Functions and Duties of the
Under Secretary of Commerce for Intellectual Property and
Director of the United States Patent and Trademark Office*